(12) United States Patent
Sakakura (10) Patent No.: US 7,443,317 B2
(45) Date of Patent: Oct. 28, 2008

(54) INPUT DEVICE

(75) Inventor: Yotaro Sakakura, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 300 days.

(21) Appl. No.: 11/490,698

(22) Filed: Jul. 21, 2006

(65) Prior Publication Data

US 2007/0025793 A1 Feb. 1, 2007

(30) Foreign Application Priority Data

Jul. 29, 2005 (JP) ............................. 2005-220400

(51) Int. Cl.
*H03M 11/00* (2006.01)
(52) U.S. Cl. ..................... 341/26; 345/168; 341/22
(58) Field of Classification Search ................. 341/22, 341/26; 345/168
See application file for complete search history.

(56) References Cited

U.S. PATENT DOCUMENTS

| | | | | |
|---|---|---|---|---|
| 4,617,554 A * | 10/1986 | Krause et al. | .................. | 341/26 |
| 5,486,824 A * | 1/1996 | Kinerk et al. | .................. | 341/26 |
| 5,539,400 A * | 7/1996 | Mears | .......................... | 341/22 |
| 5,719,597 A * | 2/1998 | Fong | ........................... | 345/174 |
| 5,760,714 A * | 6/1998 | Zimmerman | .................. | 341/26 |
| 6,040,788 A * | 3/2000 | Chambers et al. | ............. | 341/26 |
| 7,151,432 B2 * | 12/2006 | Tierling | ..................... | 340/2.28 |
| 7,230,548 B2 * | 6/2007 | Lou | ............................. | 341/26 |

FOREIGN PATENT DOCUMENTS

JP 2003-271291 9/2003

* cited by examiner

*Primary Examiner*—Albert K Wong
(74) *Attorney, Agent, or Firm*—Brinks Hofer Gilson & Lione (57) ABSTRACT

An input device is provided. An input device includes a plurality of input keys; a voltage setting unit; a switching unit; a detecting unit; and a control unit. When the switching unit selects one of the input keys, the control unit controls the detecting unit to detect voltages at least two times for a selection holding time where the selection of the input key is held. When the detected voltages do not vary or in a switching state where the variation is within a predetermined range, the control unit controls the switching unit to select the next input key after the selection holding time of the input key has elapsed. When the voltages detected at least two times vary or when the variation is beyond the predetermined range, the control unit sets the selection holding time of the input key to be longer than the switching state.

4 Claims, 9 Drawing Sheets

INPUT DEVICE

This application claims the benefit of the Japanese Patent Application No. P2005-220400 filed on Jul. 29, 2005, which is hereby incorporated by reference.

BACKGROUND

1. Field

An input device having a plurality of input keys whose outputs are detected by a variation in a resistance value is provided.

2. Related Art

Previously, an input device which includes a plurality of input keys and whose output varies in an analog manner according to a variation in pressing force applied to the input key has been provided.

Each input key whose output varies according to a variation in the pressing force applied thereto is composed of a resistor formed on a substrate and an elastically deformable contact disposed opposite to the resistor. The contact is formed of a material having a smaller specific resistance than that of the resistor. When the input key is operated to cause the contact to be pressed against the resistor, the resistance value varies due to a variation in the contact area between the contact and the resistor, which causes the voltage of the input key to vary.

It is possible to determine the operational states of all the input keys of the input device by detecting the voltages of the input keys within a predetermined period of time.

Figure 9:
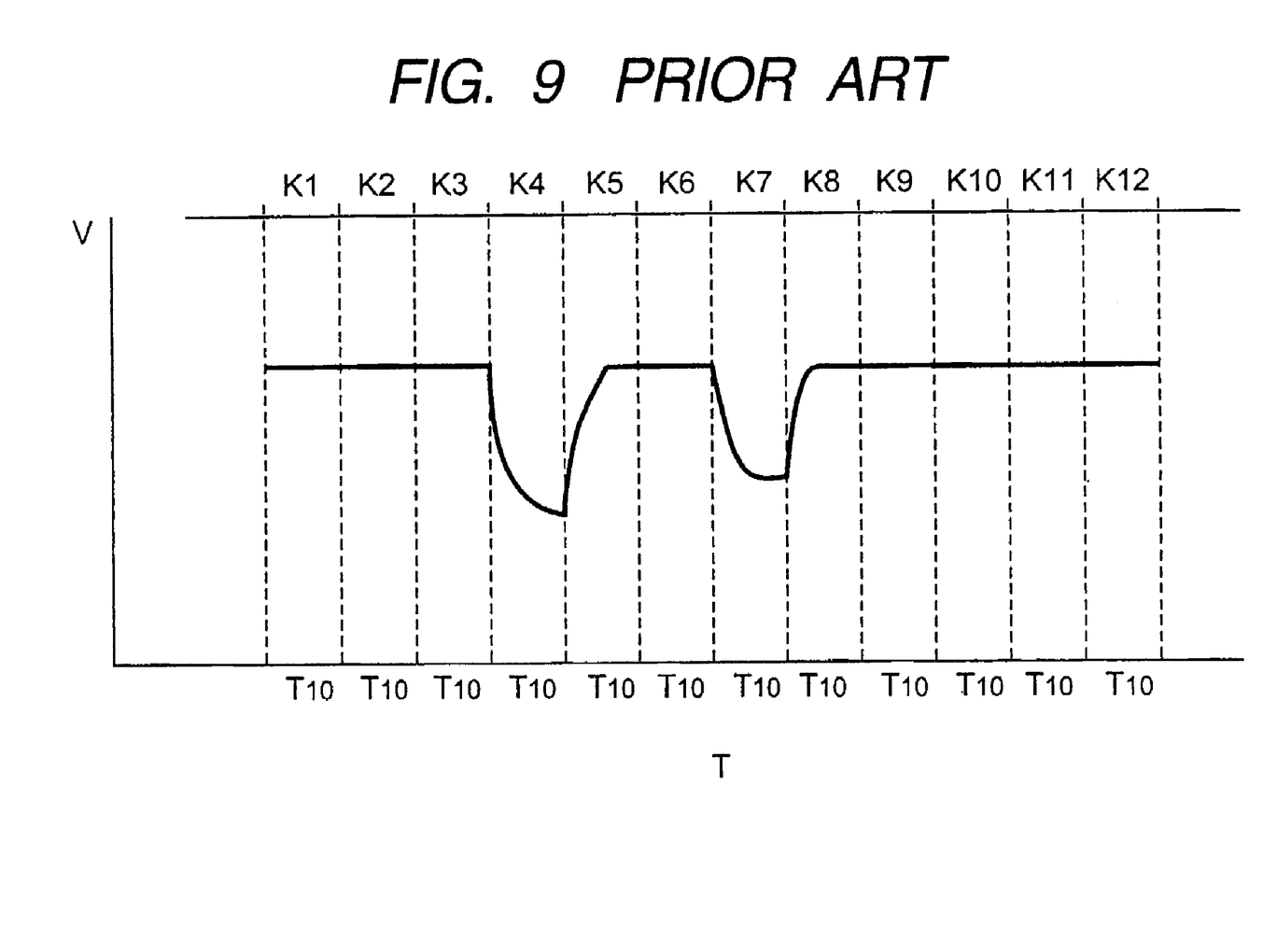
FIG. 9 is a diagram that illustrates an output detecting operation of a conventional input device.

FIG. 9 is a diagram that illustrates an output detecting operation of a conventional input device. In the output detecting operation shown in FIG. 9, an input device provided with twelve input keys K1 to K12 is used as an example. In the diagram shown in FIG. 9, a vertical axis indicates a voltage value V (output) of the input keys K1 to K12, and a horizontal axis indicates a selection holding time T required for detecting the outputs of the input keys. In FIG. 9, the further the distance from the origin to the top becomes in the vertical axis, the larger the voltage value becomes. In addition, the further the distance from the origin to the right becomes in the horizontal axis, the larger the time value becomes.

As shown in FIG. 9, in the input device, output detection starts on the basis of the voltage of the input key K1, and the output detection is performed on the basis of the voltage of the input key K2 after a predetermined selection holding time T10 has elapsed. Then, the outputs of the input keys K3 to K12 are sequentially detected on the basis of the voltages of the input keys K3 to K12 whenever the selection holding time T10 elapses.

As shown in FIG. 9, the voltage values of the input keys K1, K2, K3, K6, K9, K10, K11, and K12 are equal to each other and are higher than those of the input keys K4 and K7. Therefore, the input keys K1, K2, K3, K6, K9, K10, K11, and K12 are in non-operational states. On the other hand, the voltage values of the input keys K4 and K7 are lower than those of the input keys K1, K2, K3, K6, K9, K10, K11, and K12. Therefore, the input keys K4 and K7 are in operational states. Thus, FIG. 9 shows that the input keys K4 and K7 are in the operational states.

The input keys K5 and K8 whose outputs are detected next to the input keys K4 and K7 in the operational states have low voltages during a period from the beginning to the middle of the selection holding time T10, but the voltages thereof gradually rise from the middle of the selection holding time T10 and reach the same voltage as that of the input keys K1, K2, K3, K6, K9, K10, K11, and K12. The reason is the input keys K5 and K8, which are in the non-operational states, are affected by the variation in the voltages of the input keys K4 and K7 whose outputs have already been detected, so that the voltages thereof are lowered to the same voltage as that of the input keys K4 and K7 whose outputs have already been detected, during a part of the selection holding times T10; however, the voltages of the input keys K5 and K8 are stabilized after the part of the selection holding time T10 has elapsed, so that the original voltages of the input keys K5 and K8 are output.

It is possible to determine the operational state of the input device by detecting the outputs of the input keys K1 to K12 for every predetermined selection holding time T10, on the basis of the voltages of the input keys K1 to K12, so as to check which of the input keys K1 to K12 is operating.

JP-A-2003-271291 discloses a technique for determining the operational state of an input device by determining the operational states of a plurality of input keys during a predetermined period of time.

In the conventional input device shown in FIG. 9, the outputs of the input keys K4 and K7 in operational states are detected for a predetermined selection holding time T10. The input keys K5 and K8, which are in the non-operational states, are affected by a variation in the voltages of the input keys K4 and K7 whose outputs have already been detected. It is necessary to secure a predetermined waiting time required to stabilize the voltages. Thus, the outputs of the input keys K5 and K8 are detected in the selection holding time T10.

In the conventional input device shown in FIG. 9, it is difficult to recognize which of the input keys K1 to K12 is in an operational state or which of the outputs of the input keys K1 to K12 is detected next to the input key that is in the operational state. Therefore, the output detection is performed on all the input keys K1 to K12, including an input key in an operational state and another input key whose output will be detected next to the input key in the operational state, for the same selection holding period T10.

It requires a lot of time to detect the outputs of all the input keys K1 to K12, which makes it difficult to perform output detection at high speed.

SUMMARY

An input device includes a plurality of input keys. A voltage setting unit applies a common reference potential to one end of each of the plurality of input keys and a control unit. A switching unit sequentially selects the other ends of the plurality of input keys so as to be connected to a potential lower than the reference potential. A detecting unit detects, as an output, a variation in the reference voltage when the selected input key is switched to an on state.

In the input device, when the switching unit selects one of the input keys, the control unit controls the detecting unit to detect the output at least two times for a selection holding time where the selection of the input key is held. When the detected output does not vary or is in a switching state where the variation is within a predetermined range, the control unit controls the switching unit to select the next input key after the selection holding time of the input key has elapsed. When the output detected at least two times varies or when the variation is beyond the predetermined range, the control unit sets the selection holding time of the input key to be longer than the switching state.

In the input device according to this aspect, preferably, the control unit sets a reference selection holding time and a short holding time shorter than the reference selection holding time. Preferably, when the output detected at least two times does not vary or when the variation is within the predetermined range, the control unit sets the selection holding time of the input key to the short holding time. Preferably, when the output detected at least two times varies or when the variation is beyond the predetermined range, the control unit sets the selection holding time of the input key to the reference selection holding time.

Preferably, when one of the input keys is selected, when the output detected at least two times varies or when the variation is beyond the predetermined range, the control unit sets the selection holding time of the input key to the reference selection holding time. The control unit sets a selection holding time for at least one input key that is subsequently selected to the reference selection holding time.

The input key is switched between an on state and an off state. In the on state, the amount of a current passing through the input key varies according to the strength of operating force. The detecting unit detects a variation in the reference potential when the amount of current varies.

DESCRIPTION

Figure 1:
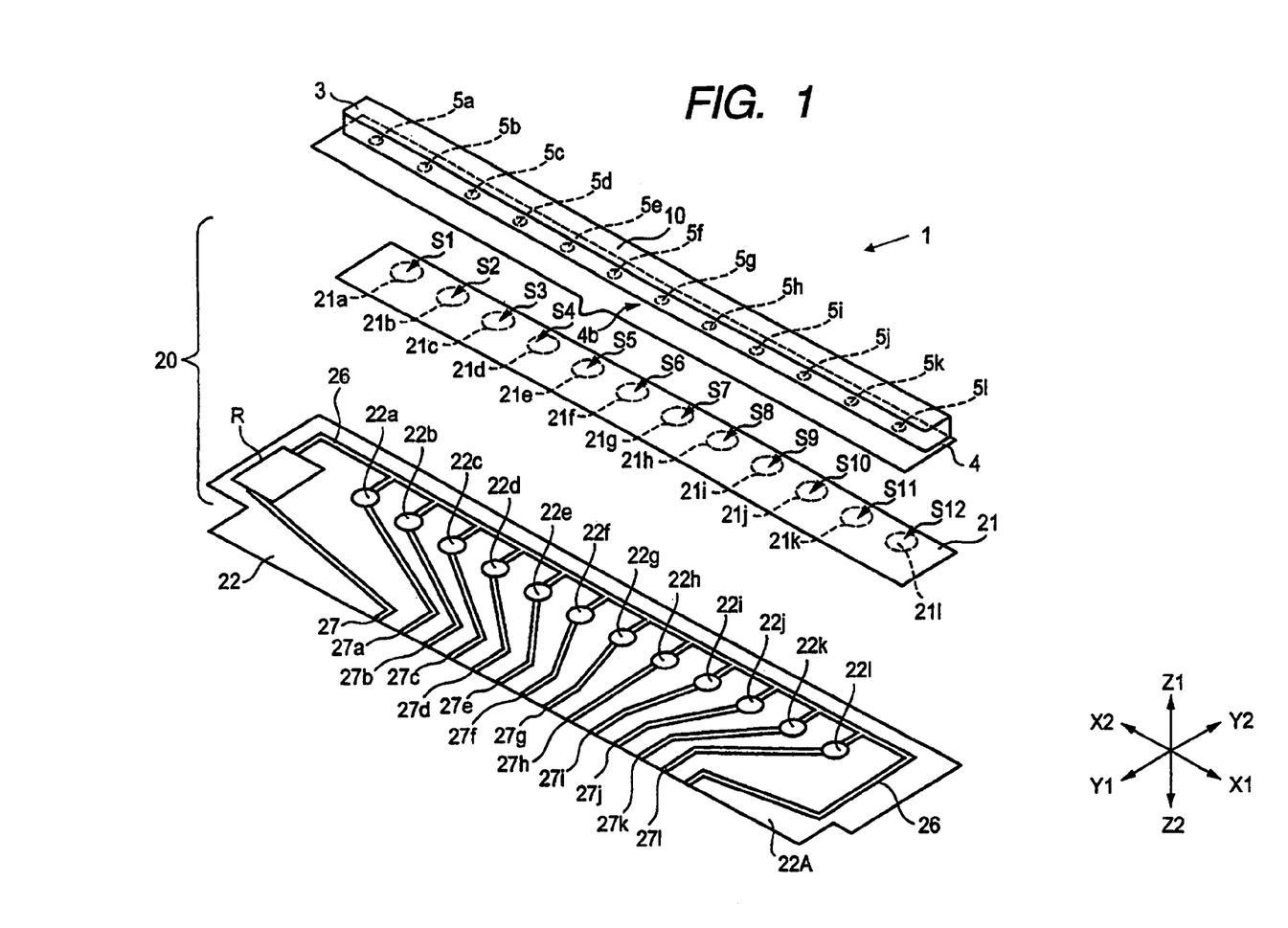
FIG. 1 is an exploded perspective view that illustrates a touch-type input device.
Figure 2:
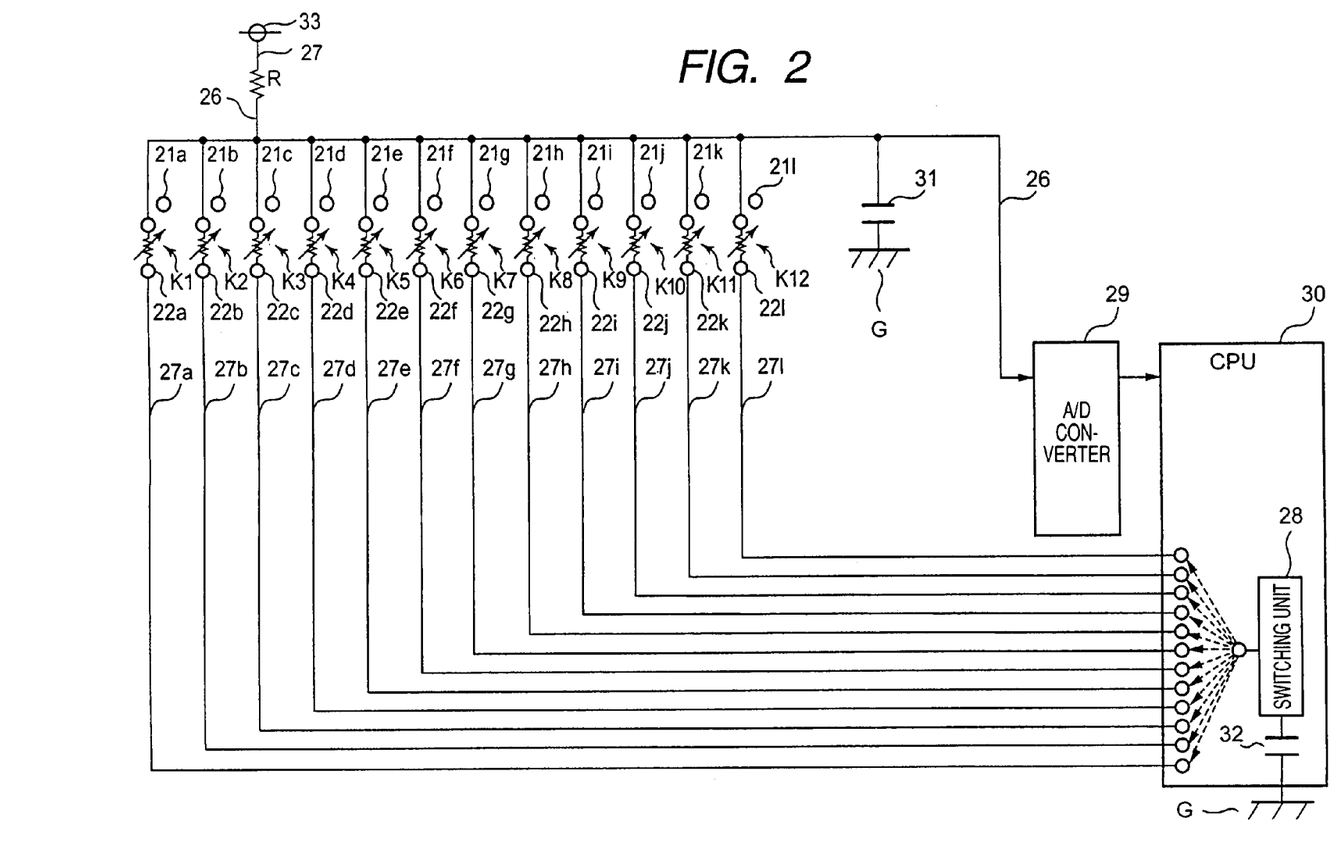
FIG. 2 is a circuit diagram that illustrates the electrical connection of the input device shown in FIG. 1.

FIG. 1 is an exploded perspective view that illustrates an input device according to an embodiment of the invention. FIG. 2 is a circuit diagram that illustrates the electrical connection of the input device shown in FIG. 1.

As shown in FIG. 1, the input device 1 includes an elastic member 3 longitudinally extending in an X direction. A membrane laminate 20 is provided on a rear surface of the elastic member 3. An input device 1 shown in FIG. 1, is used as, for example, a game controller.

The input device 1 is arranged such that an operation surface 10 of the elastic member 3 is exposed from a main body of an electronic apparatus. The elastic member 3 and the operation surface 10 function as an operating member. The elastic member 3 is formed of, for example, an elastically deformable soft material, such as silicon rubber. The operation surface 10 is formed by applying a dye composed of a material having low fractional resistance on the surface of the elastic member 3. The material forming the elastic member 3 is not limited to the silicon rubber, but the elastic member 3 may be formed of rubber-based materials other than the silicon rubber.

As shown in FIG. 1, a reinforcing member 4 is formed on a surface (rear surface) of the elastic member 3 oriented in a Z2 direction. The reinforcing member 4 has a film shape and includes a flange portion 4b protruding from the operation surface 10 to the side direction (Y1 direction in FIG. 1). The flange portion 4b is locked to a case (not shown), and has a function of preventing the elastic member 3 from being detached from the case and a waterproof function.

As shown in FIG. 1, in this embodiment, twelve hemispheric protrusions $5a$, $5b$, $5c$, $5d$, $5e$, $5f$, $5g$, $5h$, $5i$, $5j$, $5k$, and $5l$ are formed on the rear surface (a surface positioned in the Z2 direction in FIG. 1) of the reinforcing member 4 such that they are arranged at predetermined intervals in the longitudinal direction (X1-X2 direction) of the reinforcing member 4. However, the protrusions $5a$, $5b$, $5c$, $5d$, $5e$, $5f$, $5g$, $5h$, $5i$, $5j$, $5k$, and $5l$ may be formed on an upper surface (a surface positioned in a Z1 direction in FIG. 1) of an upper sheet 21, which will be described later, such that they are arranged in a straight line along the longitudinal direction of the upper sheet 21 at predetermined pitches. The number of protrusions is not limited to 12. Twelve or more protrusions or twelve or less protrusions may be provided. The shape of the protrusion is not limited to the hemisphere, but the protrusions may be formed in a conical or a cylindrical shape.

As shown in FIG. 1, the membrane laminate 20 includes the upper sheet 21 and a lower sheet 22. Both the upper sheet 21 and the lower sheet 22 are formed in strip shapes extending in the longitudinal direction (X1-X2 direction).

The upper sheet 21 and the lower sheet 22 are fixed to each other such that they are opposite to each other. The upper sheet 21 and the lower sheet 22 are formed of a flexible material, such as a PET resin or a polyimide resin.

Contacts $21a$, $21b$, $21c$, $21d$, $21e$, $21f$, $21g$, $21h$, $21i$, $21j$, $21k$, and $21l$ are formed on a lower surface of the upper sheet 21. Resistors $22a$, $22b$, $22c$, $22d$, $22e$, $22f$, $22g$, $22h$, $22i$, $22j$, $22k$, and $22l$ are formed on an upper surface of the lower sheet 22.

The contacts $21a$, $21b$, $21c$, $21d$, $21e$, $21f$, $21g$, $21h$, $21i$, $21j$, $21k$, and $21l$ and the resistors $22a$, $22b$, $22c$, $22d$, $22e$, $22f$, $22g$, $22h$, $22i$, $22j$, $22k$, and $22l$ are provided at positions opposite to the protrusions $5a$, $5b$, $5c$, $5d$, $5e$, $5f$, $5g$, $5h$, $5i$, $5j$, $5k$, and $5l$.

The resistors $22a$, $22b$, $22c$, $22d$, $22e$, $22f$, $22g$, $22h$, $22i$, $22j$, $22k$, and $22l$ are formed of, for example, a carbon film, and the contacts $21a$, $21b$, $21c$, $21d$, $21e$, $21f$, $21g$, $21h$, $21i$, $21j$, $21k$, and $21l$ are formed of, for example, a material obtained by mixing carbon black with an elastically deformable material, such as rubber. The specific resistance of the contacts $21a$, $21b$, $21c$, $21d$, $21e$, $21f$, $21g$, $21h$, $21i$, $21j$, $21k$, and $21l$ is set to be smaller than that of the resistors $22a$, $22b$, $22c$, $22d$, $22e$, $22f$, $22g$, $22h$, $22i$, $22j$, $22k$, and $22l$.

As shown in FIG. 2, the contact $21a$ and the resistor $22a$ which are opposite to each other form an input key K1. Similarly, the contact $21b$ and the resistor $22b$ form an input key K2. The contact $21c$ and the resistor $22c$ form an input key K3. The contact $21d$ and the resistor $22d$ form an input key K4. The contact $21e$ and the resistor $22e$ form an input key K5. The contact $21f$ and the resistor $22f$ form an input key K6. The contact $21g$ and the resistor $22g$ form an input key K7. The contact $21h$ and the resistor $22h$ form an input key K8. The contact $21i$ and the resistor $22i$ form an input key K9. The contact $21j$ and the resistor $22j$ form an input key K10. The contact $21k$ and the resistor $22k$ form an input key K11. The contact $21l$ and the resistor $22l$ form an input key K12. In this way, a plurality of input keys K1 to K12 are formed in the input device 1, and twelve input keys are formed in this embodiment, as shown in FIG. 1.

The input keys K1 to K12 are arranged on the membrane laminate 20 in the longitudinal direction (X1-X2 direction) thereof at predetermined pitches. In this embodiment, the intervals among the input keys K1 to K12 and the intervals among the protrusions 5a, 5b, 5c, 5d, 5e, 5f, 5g, 5h, 5i, 5j, 5k, and 5l are not limited to specific values, but the intervals may be arbitrarily set, if necessary.

As shown in FIG. 1, lead patterns 27a, 27b, 27c, 27d, 27e, 27f, 27g, 27h, 27i, 27j, 27k, and 27l are connected to the resistors 22a to 22l provided on the lower sheet 22, and the lead patterns 27a to 27l extend from a lead-out portion 22A to the outside.

As shown in FIG. 1, the resistors 22a to 22l are connected to one another by a connecting pattern 26. One end of the connecting pattern 26 is connected to a resistor R formed on the lower sheet 22, and the other end thereof extends from the lead-out portion 22a to the outside. A lead pattern 27 is connected to the resistor R, and the lead pattern 27 extends from the lead-out portion 22A to the outside.

As shown in FIG. 2, the lead pattern 27 is connected to a power supply (Vcc) 33. The other end of the connecting pattern 26 is connected to an A/D converter 29 and the A/C converter 29 is connected to a CPU 30, serving as a control unit in the invention. The connecting pattern 26 is connected to the ground G through a voltage stabilizing capacitor 31 between the resistor 22l and the A/D converter 29. The power supply (Vcc) 33 serves as a voltage setting unit for applying a reference voltage to one end of each of the resistors 22a to 22l forming the input keys K1 to K12 in the invention.

The lead patterns 27a, 27b, 27c, 27d, 27e, 27f, 27g, 27h, 27i, 27j, 27k, and 27l are connected to a switching unit 28 provided in the CPU 30. The switching unit 28 is connected to the ground G through a voltage stabilizing capacitor 32.

In the input device 1, a common reference potential is applied from the power supply (Vcc) 33 to the input keys K1 to K12. When an operator pushes the operation surface 10 by using, for example, fingers or an operating tool, such as a pen, the operating tool is opposite to the input key K3 of the input keys K1 to K12.

At that time, local deformation occurs around the input key K3 in the elastic member 3. The deformation of the elastic member 3 causes the pushed protrusion 5c to locally deform the upper sheet 21, so that the contact area between the contact 21c of the upper sheet 21 and the resistor 22c of the lower sheet 22 varies. The variation in the contact area causes the resistance value of the resistor 22c to vary, resulting in a variation in the voltage of the input key K3.

Similarly, the operator can vary the voltages of the input keys K1 to K12 by pushing the input keys K1 to K12 with an operating tool.

When the input keys K1 to K12 are not pushed or when pressing force is weak, a reference voltage is applied from the power supply (Vcc) 33 to the input keys K1 to K12. When the input keys K1 to K12 are pushed or when strong pressing force is applied, a current flows through the lead patterns 27a, 27b, 27c, 27d, 27e, 27f, 27g, 27h, 27i, 27j, 27k, and 27l corresponding to the pushed input keys K1 to K12, and thus the voltages (potentials) of the pushed input keys K1 to K12 vary. For example, a voltage (potential) causing the contact areas between the contacts 21a to 21l and the resistors 22a to 22l to increase is lowered, and a voltage (potential) causing the contact areas between the contacts 21a to 21l and the resistors 22a to 22l to decrease is raised. Therefore, output varies in an analog manner according to a variation in the pressing force applied to the input keys K1 to K12. The output is transmitted to the CPU 30 on the basis of the variation in voltage, and the CPU 30 also serves as a detecting unit that detects the output.

The switching unit 28 sequentially selects the lead patterns 27a to 27l and connects the selected one of the lead patterns 27a to 27l to a potential lower than the reference potential.

The switching unit 28 selects one of the lead patterns 27a to 27l to be connected to the CPU 30. As represented by solid lines in FIG. 2, the lead pattern 27a is connected to the CPU 30. As represented by dashed lines, the lead patterns 27b to 27l are sequentially connected to the Switching unit 28.

The A/D converter 29 converts an analog signal, which is an output signal, into a digital signal on the basis of variation in the voltages of the input keys K1 to K12 and transmits the converted signal to the CPU 30. The CPU 30 detects the outputs of the input keys K1 to K12 on the basis of the digital signal transmitted from the A/D converter 29 to determine the operational state of the input keys. The detected output signals of the input keys K1 to K12 are displayed as a predetermined image on a display unit provided in a main body, for example, of a game machine.

In the input device 1, the switching unit 28 is driven to select one of the input keys K1 to K12, that is, the lead patterns 27a to 27l of the input keys K1 to K12, to be connected to the CPU 30, so that the input keys K1 to K2 are sequentially connected to the CPU 30 at a predetermined time interval. The outputs of the input keys K1 to K12 are sequentially transmitted to the CPU 30, which makes it possible to determine the operational states of all the input keys K1 to K12 in a predetermined period of time.

Figure 3:
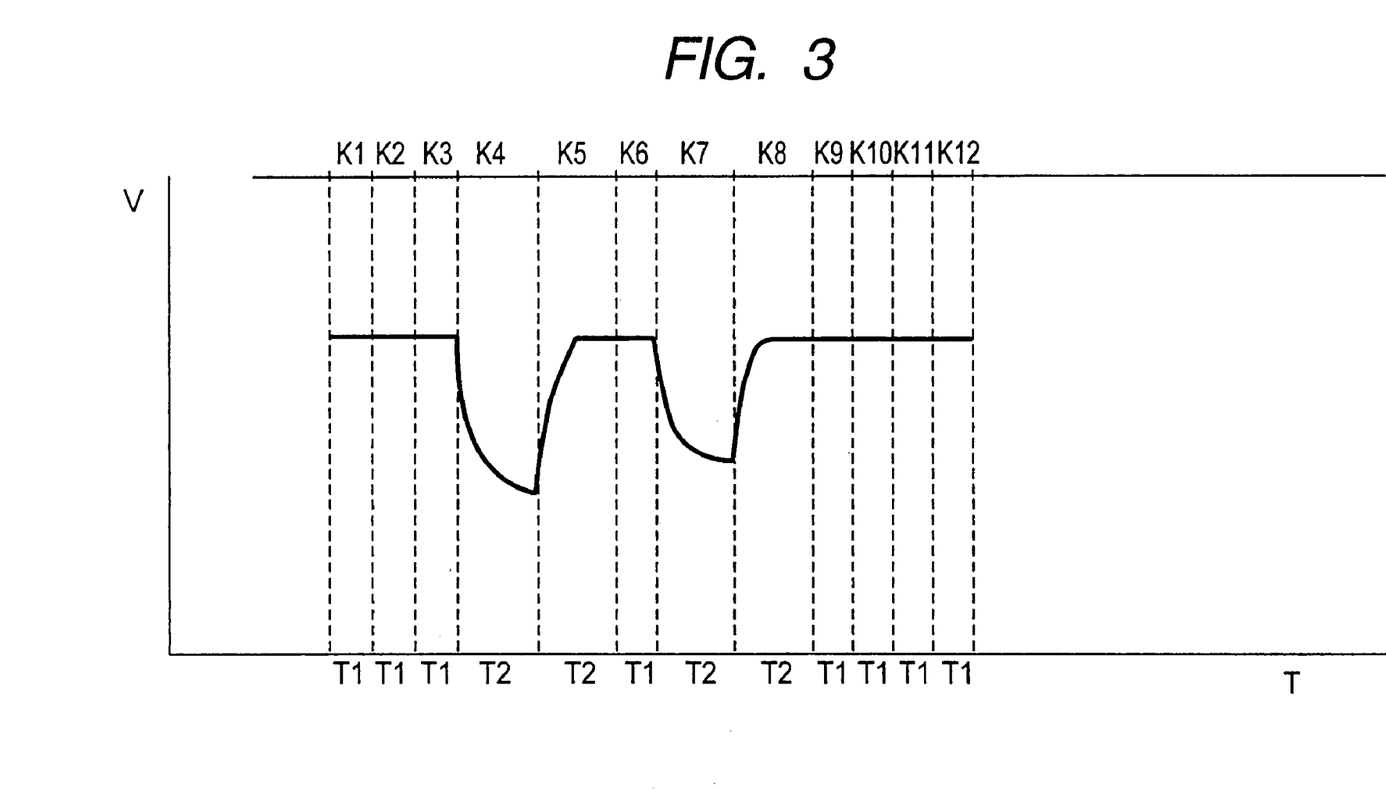
FIG. 3 is a diagram that illustrates an operation of detecting the output of the input device shown in FIG. 1.

FIG. 3 is a diagram that illustrates an example of an operation of detecting the output of the input device 1. In the diagram shown in FIG. 3, the vertical axis indicates voltage values V (potentials, that is, outputs) of the input keys K1 to K12, and the horizontal axis indicates a selection holding time T for output detection. In FIG. 3, the further the distance from the origin to the top becomes in the vertical axis, the larger the voltage value becomes. In addition, the further the distance from the origin to the right becomes in the horizontal axis, the larger the time value becomes.

As shown in FIG. 3 of the output detecting operation, in the input device 1, the lead pattern 27a of the input key K1 is connected to the CPU 30 by the switching unit 28. This connection is performed for a short holding time T1, which is a selection holding time when the selection of the input key K1 is held.

The CPU 30 detects a variation in the voltage of the input key K1 for the short holding time T1 and determines whether the input key K1 is pushed. After the short holding time T1 has elapsed, the switching unit connects the lead pattern 27b of the input key K2 to the CPU 30, and the CPU 30 detects a variation in the voltage of the input key K2 for the short holding time T1 and determines whether the input key K2 is pushed. Thereafter, the CPU 30 sequentially detects outputs on the basis of the voltages of the input keys K3 to K12 whenever a predetermined short holding time T1 or a reference selection holding time T2, which will be described later, has elapsed.

In the output detecting operation shown in FIG. 3, the input keys K1, K2, K3, K6, K9, K10, K11, and K12 have the same voltage values, and the input keys K4 and K7 have voltage values lower than those of the input keys K1, K2, K3, K6, K9, K10, K11, and K12. Therefore, the input keys K1, K2, K3, K6, K9, K10, K11, and K12 are in an off state, that is, a non-operational state.

The voltages of the input keys K4 and K7 are gradually lowered in the reference selection holding time T2, which is the selection holding time when the selection of the input keys K4 and K7 is held, as compared with the input keys K1, K2, K3, K6, K9, K10, K11, and K12. In the input keys K4 and K7, the contact between the contacts 21d and 21g and the resistors 22d and 22g causes the input keys K4 and K7 to be turned on. In the output detecting operation shown in FIG. 3, the input keys K4 and K7 are in operational states. It is possible to turn on or off the input keys K1 to K12.

In the output detecting operation shown in FIG. 3, the voltage of the input key K4 is lower than that of the input key K7. This is because the contact area between the contact 21*d* and the resistor 22*d* of the input key K4 is larger than the contact area between the contact 21*g* and the resistor 22*g* of the input key K7. This is because the pressing force (operating force) applied against the input key K4 by the operating tool is stronger than the pressing force (operating force) applied against the input key K7 by the operating tool. In the input device 1, the amount of current varies according to the pressing force (operating force) applied against the input keys K1 to K12, which causes output voltages (potential) to vary. It is possible to detect outputs that vary in an analog manner according to the pressing force (operating force) applied against the input keys K1 to K12.

As shown in FIG. 3, in the input keys K5 and K8 whose outputs are to be detected next to the input keys K4 and K7 in the operational state, the voltages thereof are low at the beginning of the reference selection holding time T2, and gradually increase to the voltages of the input keys K1, K2, K3, K6, K9, K10, K11, and K12 in the middle of the reference selection holding time T2 because the input keys K5 and K8, which are in the operational state, are affected by a variation in the voltage of the input keys K4 and K7 whose outputs have already been detected, and thus the voltages of the input keys K5 and K8 are lowered to the voltages of the input keys K4 and K7 whose outputs have already been detected during a part of the reference selection holding time T2. However, after the part of the reference selection holding time T2 has elapsed, the voltages of the input keys K5 and K8 are stabilized, so that the original voltages are output.

It is possible to check which of the input keys K1 to K12 is operating and thus determine the operational state of the input device 1 by detecting the outputs of the input keys K1 to K12 on the basis of a variation in the voltages thereof whenever the short holding time T1 or the reference selection holding time T2 has elapsed.

As shown in FIG. 3, in the input device 1, the short holding time T1 of each of the input keys K1, K2, K3, K6, K9, K10, K11, and K12, which are in a non-operational state, is shorter than the reference selection holding time T2 of each of the input keys K4 and K7, which are in an operational state, and the reference selection holding time T2 of each of the input keys K5 and K8 whose outputs are to be detected next to the input keys K4 and K8.

The short holding time T1 and the reference selection holding time T2 of the output detecting operation shown in FIG. 3 will be described in detail with reference to FIGS. 4 to 8.

Figure 4:
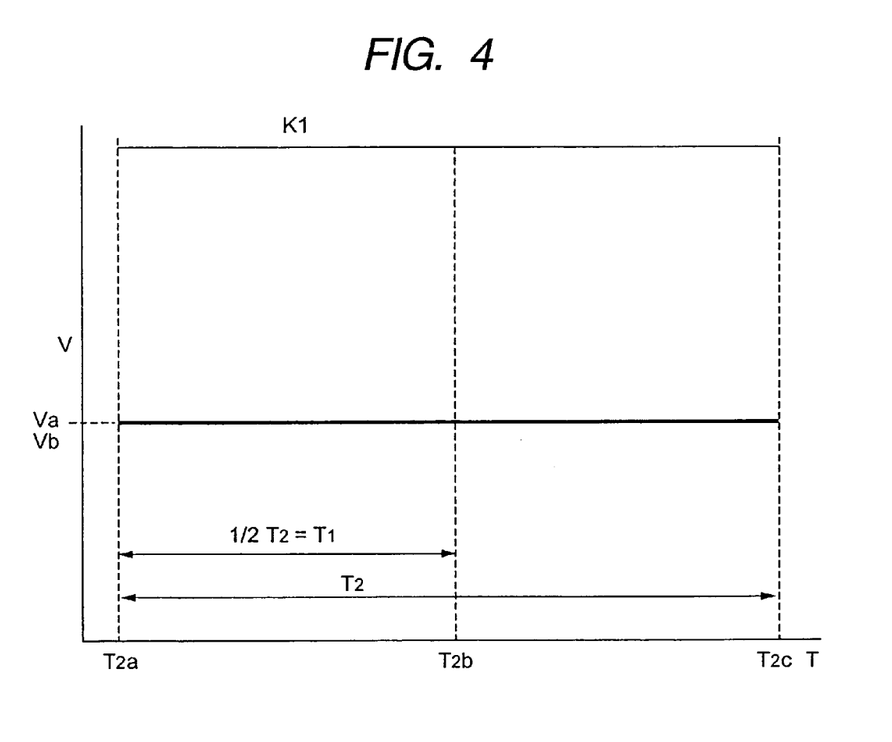
FIG. 4 is a diagram that illustrates the output detecting operation shown in FIG. 3.

FIG. 4 is a diagram that illustrates an operation of detecting the output of the input key K1 in the output detecting operation shown in FIG. 3. In FIG. 4, the further the distance from the origin to the top becomes in the vertical axis, the larger the voltage value becomes. The further the distance from the origin to the right side becomes in the horizontal axis, the larger the time value becomes. As shown in FIG. 4, in the input device 1 of this embodiment, a reference selection holding time T2 required for detecting the output of the input key is set. As shown in FIG. 4, a start time of the reference selection holding time T2 is represented by T2*a*, and an end time thereof is represented by T2*c*.

In the operation of detecting the output of the input key K1, first, a voltage Va (detected output) of the input key K1 at the start time T2*a* of the reference selecting hold time T2 is measured. The measured voltage Va is transmitted to the CPU 30 through the A/D converter 29.

A voltage Vb (detected voltage) of the input key K1 is measured at a time T2*b*, which is a point of time after half the reference selection holding time T2 has elapsed from the start time T2*a*. The measured voltage Vb is also transmitted to the CPU 30 through the A/D converter 29.

When it is determined that the voltage Va and the voltage Vb are equal to each other and do not vary (switching state), the output detection of the input key K1 ends at the time T2*b*, after half the reference selection holding time T2 has elapsed. As shown in FIG. 4, since the voltage Va and the voltage Vb of the input key K1 are equal to each other, the CPU 30 ends the output detection at the time T2*b*. As shown in FIG. 4, a time about ½T2 from the start time T2*a* to the time T2*b* is the short holding time T1 shown in FIG. 3.

A predetermined image is displayed on a display unit provided in, for example, a game machine on the basis of the voltage Vb, which is an effective value, at the time T2*b* (when the detection of output ends).

As shown in FIG. 3, the outputs of the input keys K2, K3, K6, K9, K10, K11, and K12 are detected by the same output detection operation as that used for the input key K1.

Figure 5:
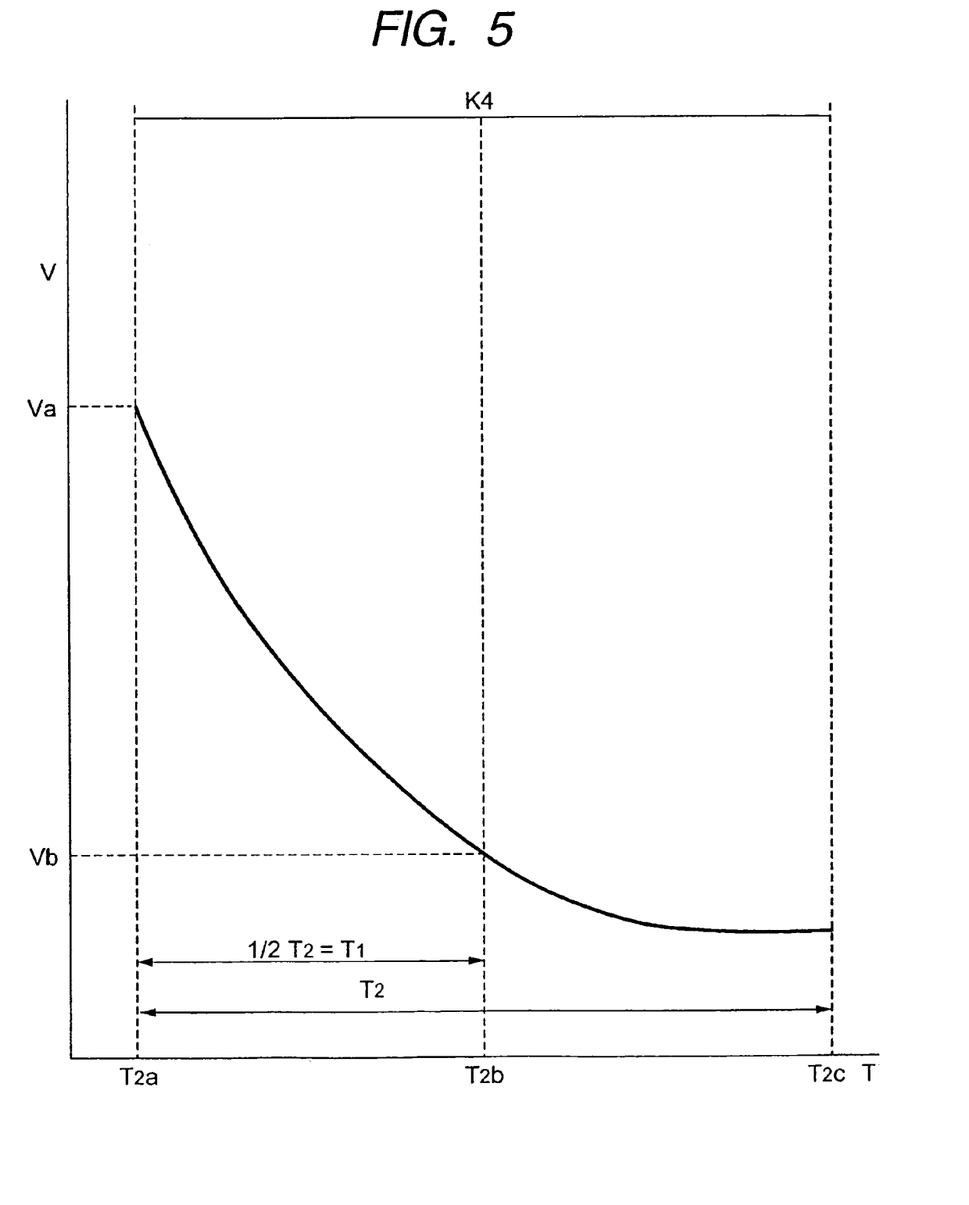
FIG. 5 is a diagram that illustrates the output detecting operation shown in FIG. 3.

FIG. 5 is a diagram that illustrates an operation of detecting the output of the input key K4 of the output detecting operation shown in FIG. 3. In FIG. 5, the further the distance from the origin to the top becomes in the vertical axis, the larger the voltage value becomes. The further the distance from the origin to the right becomes in the horizontal axis, the larger the time value becomes. As described above, in the input device 1 of the invention, a reference selection holding time T2 is set for performing the output detection. As shown in FIG. 5, a start time of the reference selection holding time T2 is represented by T2*a*, and an end time thereof is represented by T2*c*.

In the operation of detecting the output of the input key K4, a voltage Va (detected output) of the input key K4 at the start time T2*a* of the reference selecting hold time T2 is measured. The measured voltage Va is transmitted to the CPU 30 through the A/D converter 29.

A voltage Vb of the input key K4 is measured at a time T2*b*, which is a point of time after half the reference selection holding time T2 has elapsed from the start time T2*a* (after the short holding time T1 has elapsed). The measured voltage Vb (detected output) is also transmitted to the CPU 30 through the A/D converter 29.

As shown in FIG. 5, in the input key K4, the voltage Vb is lower than the voltage Va. For example, since the voltage Va and the voltage Vb vary, it is determined that the input key K4 is in an operational state. When it is determined that the voltage Vb is lower than the voltage Va and the voltages Va and Vb vary, the output detection of the input key K4 ends at the end time T2*c* of the reference selection holding time T2. In the input device 1 of the invention, the CPU 30 sets the reference selection holding time T2 so as to be longer than the short holding time T1 in the case in which the voltage Va and the voltage Vb are equal to each other and do not vary (switching state).

A predetermined image is displayed on a display unit provided in, for example, a game machine on the basis of the voltage Vc, which is an effective value, at the end time T2*c* when the detection of output ends.

Figure 6:
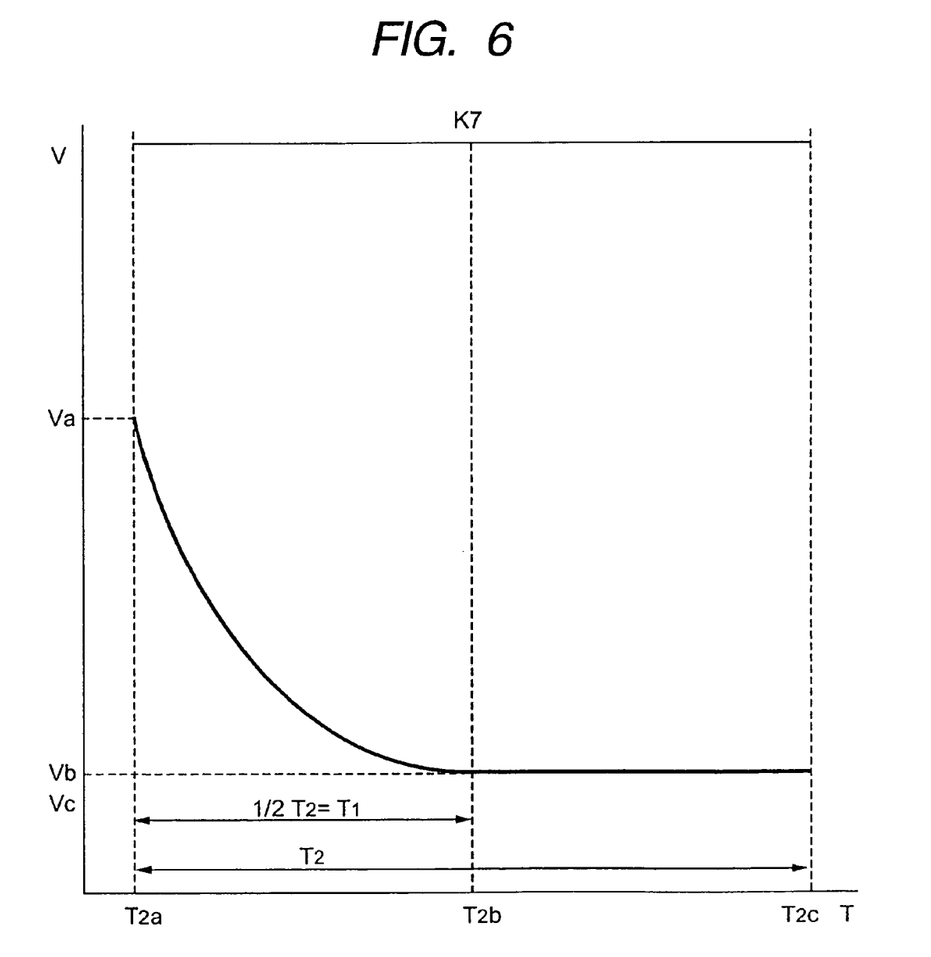
FIG. 6 is a diagram that illustrates the output detecting operation shown in FIG. 3.

FIG. 6 is a diagram that illustrates an operation of detecting the output of the input key K7 of the output detecting operation shown in FIG. 3. In FIG. 6, the further the distance from the origin to the top becomes in the vertical axis, the larger the voltage value becomes. In addition, the further the distance from the origin to the right becomes in the horizontal axis, the larger the time value becomes. As described above, in the input device 1 of the invention, a reference selection holding time T2 is set for performing the output detection. As shown in FIG. 6, a start time of the reference selection holding time T2 is represented by T2$a$, and an end time thereof is represented by T2$c$.

In the operation of detecting the output of the input key K7, first, a voltage Va (detected output) of the input key K7 at the start time T2$a$ of the reference selecting hold time T2 is measured. The measured voltage Va is transmitted to the CPU 30 through the A/D converter 29.

A voltage Vb of the input key K7 is measured at a time T2$b$, which is a point of time after half the reference selection holding time T2 has elapsed from the start time T2$a$ (after the short holding time T1 has elapsed). The measured voltage Vb (detected output) is also transmitted to the CPU 30 through the A/D converter 29.

As shown in FIG. 6, in the input key K7, the voltage Vb is lower than the voltage Va. For example, since the voltage Va and the voltage Vb vary, it is determined that the input key K7 is in an operational state. When it is determined that the voltage Vb is lower than the voltage Va and the voltages Va and Vb vary, the output detection of the input key K7 is ended at the end time T2$c$ of the reference selection holding time T2. For example, in the input device 1 of the invention, the CPU 30 sets the reference selection holding time T2 so as to be longer than the short holding time T1 in the case in which the voltage Va and the voltage Vb are equal to each other and do not vary (switching state).

A predetermined image is displayed on a display unit provided in, for example, a game machine on the basis of the voltage Vc, which is an effective value, at the end time T2$c$ when the detection of output is ended.

Figure 7:
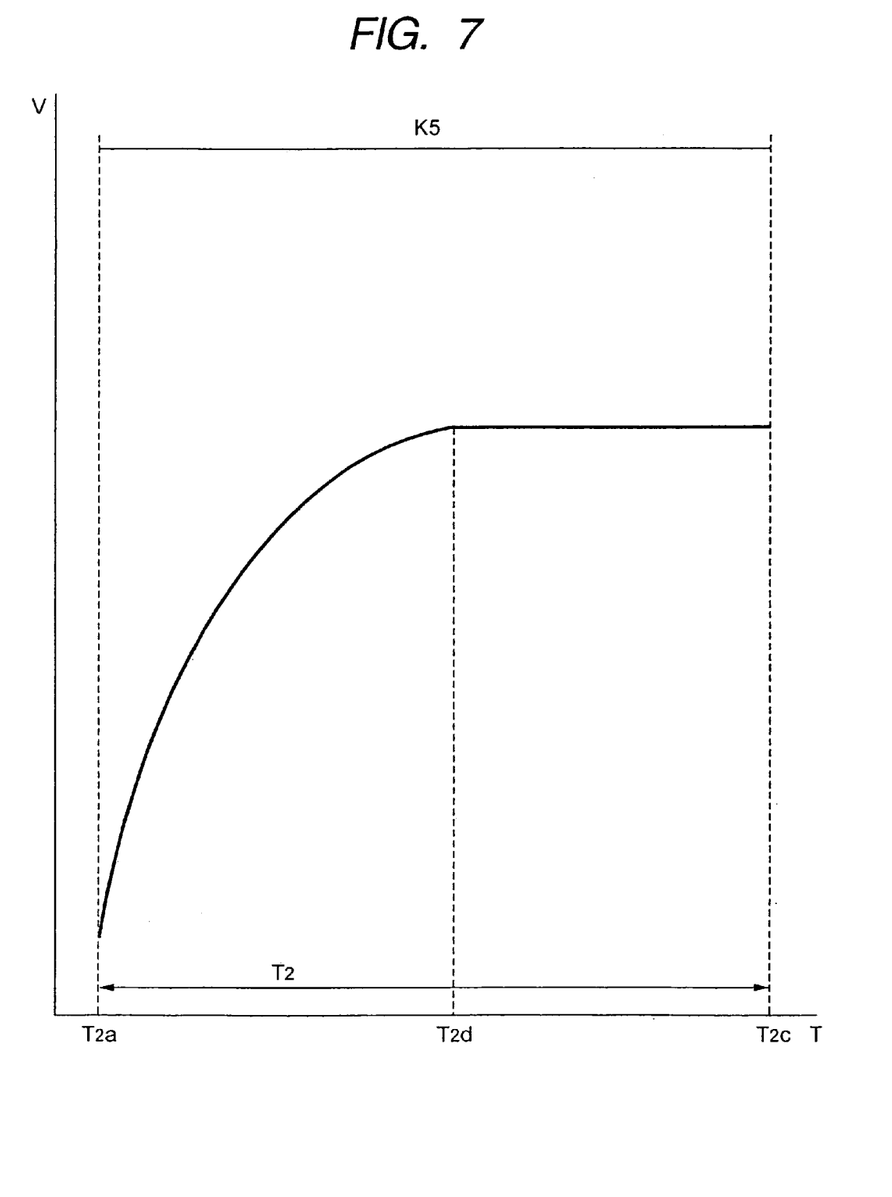
FIG. 7 is a diagram that illustrates the output detecting operation shown in FIG. 3.

FIG. 7 is a diagram that illustrates an operation of detecting the output of the input key K5 of the output detecting operation shown in FIG. 3. In FIG. 7, the further the distance from the origin to the top becomes in the vertical axis, the larger the voltage value becomes. The further the distance from the origin to the right becomes in the horizontal axis, the larger the time value becomes. As described above, in the input device 1 of the invention, a reference selection holding time T2 is set for performing the output detection. As shown in FIG. 7, a start time of the reference selection holding time T2 is represented by T2$a$, and an end time thereof is represented by T2$c$.

Since the input key K5 is arranged next to the input key K4 that is in an operational state as described above, the input key K5 is affected by a variation in the voltage of the input key K4 when the output thereof is detected. Therefore, in a period from a time T2$a$ to a time T2$d$ of the reference selection holding time T2, the voltage of the input key K5 is lowered by the voltage of the input key K4 whose output has already been detected, and the voltage of the input key K5 is stabilized after the period from the time T2$a$ to the time T2$d$ of the reference selection holding time T2 has elapsed. As a result, the original voltage is output.

In the input key K5, since the time required to output the original voltage, that is, the period from the time T2$a$ to the time T2$d$ varies by, for example, the voltage of the input key K4 whose output has already been detected, it is impossible to uniformly set the period from the time T2$a$ to the time T2$d$. Therefore, as shown in FIG. 7, in the input key K5 whose output is detected next to the input key K4 in the operational state, the output detection is performed in a period from the start time T2$a$ of the output detection to the end time T2$c$, that is, for the reference selection holding time T2, regardless of a variation in voltage for the reference selection holding time T2.

A predetermined image is displayed on a display unit provided in, for example, a game machine on the basis of the voltage Vc, which is an effective value, at the end time T2$c$ when the detection of output is ended.

Figure 8:
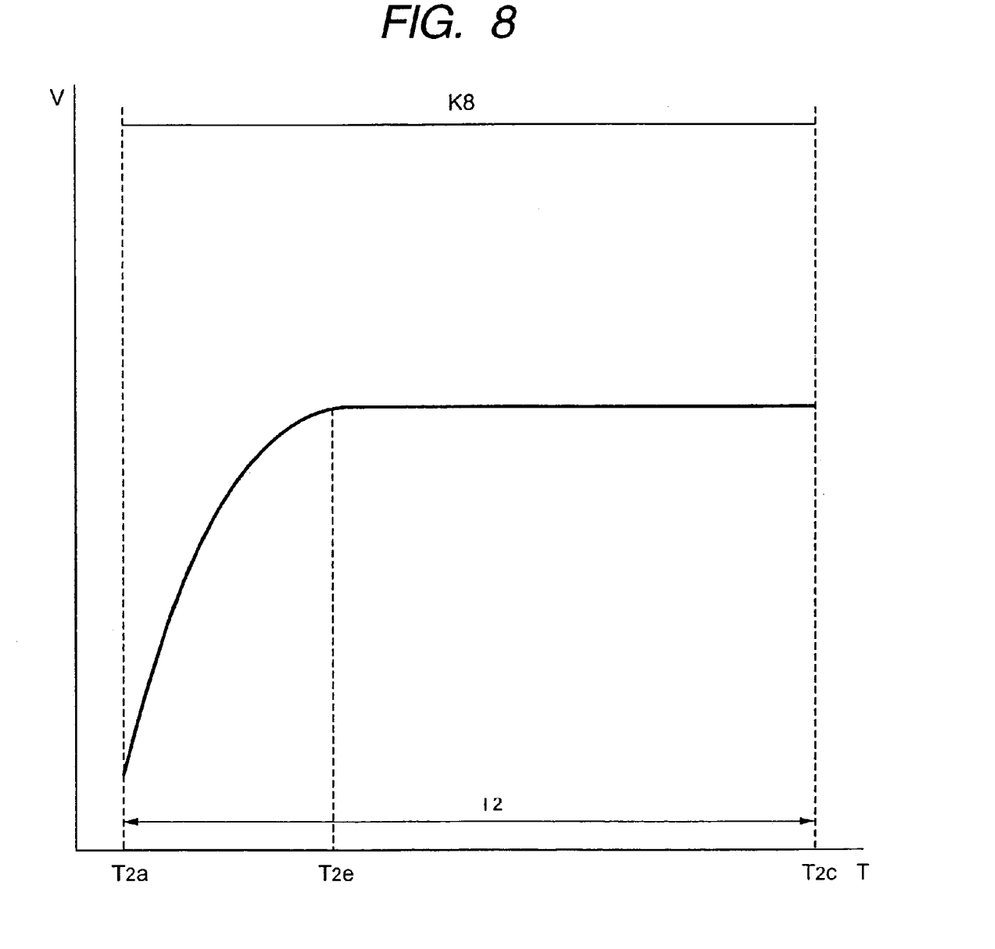
FIG. 8 is a diagram that illustrates the output detecting operation shown in FIG. 3.

FIG. 8 is a diagram that illustrates an operation of detecting the output of the input key K8 of the output detecting operation shown in FIG. 3. In FIG. 8, the further the distance from the origin to the top becomes in the vertical axis, the larger the voltage value becomes. The further the distance from the origin to the right becomes in the horizontal axis, the larger the time value becomes. As described above, in the input device 1 of the invention, a reference selection holding time T2 is set for performing the output detection. As shown in FIG. 8, a start time of the reference selection holding time T2 is represented by T2$a$, and an end time thereof is represented by T2$c$.

Since the input key K8 is arranged next to the input key K7 that is in an operational state as described above, the input key K8 is affected by a variation in the voltage of the input key K7 when the output thereof is detected. Therefore, in a period from a time T2$a$ to a time T2$e$ of the reference selection holding time T2, the voltage of the input key K8 is lowered by the voltage of the input key K7 whose output has already been detected, and the voltage of the input key K8 is stabilized after the period from the time T2$a$ to the time T2$d$ of the reference selection holding time T2 has elapsed. As a result, the original voltage is output.

In the input key K8, since the time required to output the original voltage, that is, the period from the time T2$a$ to the time T2$e$ varies by, for example, the voltage of the input key K7 whose output has already been detected, it is impossible to uniformly set the period from the time T2$a$ to the time T2$e$. Therefore, as shown in FIG. 8, in the input key K8 whose output is detected next to the input key K7 in the operational state, the output detection is performed in a period from the start time T2$a$ of the output detection to the end time T2$c$, that is, for the reference selection holding time T2, regardless of a variation in voltage for the reference selection holding time T2.

As shown in FIG. 3, in the input device 1 of the invention, when the output detection is performed to determine the operational states of the input keys K1 to K12, the time required to detect the outputs of the input keys K1, K2, K3, K6, K9, K10, K11, and K12 other than the input keys K5 and K8, which are in a non-operational state and whose outputs are detected next to the operational state, are a time T1 that is half the reference selection holding time T2, and thus it is not necessary to uniformly secure a waiting time required until the voltage of an input key whose output is detected next to the input key that is in an operational state is stabilized for all the input keys K1 to K12.

As compared with an output detecting operation of a conventional input device where a uniform waiting time is secured for all of the input keys K1 to 12 in consideration of the waiting time, it is possible to considerably reduce the time required to detect the outputs of the all the input keys K1 to K12, which makes it possible to detect the outputs of all the input keys K1 to K12 at high speed.

In FIGS. 3 to 8, the voltage Va of the start time T2$a$ of the reference selection holding time T2 is compared with the voltage Vb of the time T2$b$, which is a point of time after half the reference selection holding time T2 has elapsed, but the invention is not limited thereto. For example, the voltage Va of the start time T2$a$ of the reference selection holding time T2 may be compared with the voltage of a point of time after one third of the reference selection holding time T2 has elapsed. The voltage of the start time T2a may be compared with the voltage of a point of time after an arbitrary time has elapsed from the start time T2a.

In FIGS. 3 to 8, the output detection is performed two times, for example, at the start time T2a and the time T2b, but the invention is not limited thereto. For example, the output detection may be performed three or more times for the reference selection holding time T2, and the detected outputs (voltages) may be compared to detect a variation in output.

In FIG. 4, the voltage Va and the voltage Vb do not vary. However, when the voltage Va and the voltage Vb vary within a predetermined voltage range, the output detection may end at the short holding time T1. On the other hand, when the voltage Va and the voltage Vb vary beyond a predetermined voltage range, the output detection may end at the reference selection holding time T2, as shown in FIGS. 5 and 6.

In the embodiment shown in FIG. 3, the outputs of the input keys K4 and K7 in an operational state and the outputs of the input keys K5 and K8 to be detected next to the input keys K4 and K7 are detected for the reference selection holding time T2. However, in the invention, the outputs of two or more input keys K1 to K12 to be detected next to an input key K1 to K12 that is in an operational state may be detected for the reference selection holding time T2.

In the output detecting operation shown in FIG. 3, the input keys K4 and K7 are in an operational state, but the invention is not limited thereto. For example, even when any one of the input keys K1 to K12 is in an operational state, the output detecting operation may be performed by the same method as shown in FIG. 3.

In the above-described embodiment, the reference selection holding time T2 is arbitrarily set. However, when the input device 1 is used as a game controller, the reference selection holding time T2 may be set to, for example, 40 μs. Further, the input device 1 may be used as various devices other than the game controller. In this case, it is also possible to arbitrarily set the reference selection holding time T2.

In FIGS. 1 to 3, the input device 1 is provided with twelve input keys K1 to K12, but the number of input keys is not limited to twelve in the invention.

As described above, in the input device of the invention, output detection is performed on input keys, which are in a non-operational state, other than an input key in an operational state and another input key whose output will be detected next to the input key in the operational state, for a selection holding time which is shorter than the selection holding time of the input key in the operational state. It is unnecessary to set, to all of the input keys, the same waiting time required for the voltage of the input key whose output will be detected next to the input key in the operational state to be stabilized.

It is possible to considerably reduce the time required for detecting the outputs of all the input keys and thus detect the outputs of all the input keys at high speed.

The invention claimed is:

1. An input device comprising:
a plurality of input keys;
a voltage setting unit that applies a common reference potential to one end of each of the plurality of input keys;
a switching unit that selects the other ends of the plurality of input keys so as to be connected to a potential lower than the reference potential;
a detecting unit that detects, as an output, a variation in the reference voltage when the selected input key is switched to an on state; and
a control unit,
wherein, when the switching unit selects one of the input keys, the control unit controls the detecting unit to detect the output at least two times for a selection holding time where the selection of the input key is held, and, when the detected output does not vary or in a switching state where the variation is within a predetermined range, controls the switching unit to select the next input key after the selection holding time of the input key has elapsed, and
when the output detected at least two times varies or when the variation is beyond the predetermined range, the control unit sets the selection holding time of the input key to be longer than the switching state.

2. The input device according to claim 1,
wherein the control unit sets a reference selection holding time and a short holding time shorter than the reference selection holding time,
when the output detected at least two times does not vary or when the variation is within the predetermined range, the control unit sets the selection holding time of the input key to the short holding time, and
when the output detected at least two times varies or when the variation is beyond the predetermined range, the control unit sets the selection holding time of the input key to the reference selection holding time.

3. The input device according to claim 2,
wherein, when one of the input keys is selected, when the output detected at least two times varies or when the variation is beyond the predetermined range, the control unit sets the selection holding time of the input key to the reference selection holding time, and
the control unit sets a selection holding time for at least one input key that is subsequently selected to the reference selection holding time.

4. The input device according to claim 1,
wherein the input key is switched between an on state and an off state,
in the on state, the amount of a current passing through the input key varies according to the strength of operating force, and
the detecting unit detects a variation in the reference potential when the amount of current varies.

* * * * *